United States Patent
Namioka et al.

(10) Patent No.: US 11,322,668 B2
(45) Date of Patent: May 3, 2022

(54) SEMICONDUCTOR DEVICE

(71) Applicant: RENESAS ELECTRONICS CORPORATION, Tokyo (JP)

(72) Inventors: Seigo Namioka, Tokyo (JP); Yasutaka Nakashiba, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 21 days.

(21) Appl. No.: 16/811,910

(22) Filed: Mar. 6, 2020

(65) Prior Publication Data
US 2020/0287108 A1 Sep. 10, 2020

(30) Foreign Application Priority Data
Mar. 8, 2019 (JP) .............. JP2019-042173

(51) Int. Cl.
*H01L 33/58* (2010.01)
*H01S 5/026* (2006.01)
*H01L 25/16* (2006.01)
*H01L 33/00* (2010.01)

(52) U.S. Cl.
CPC ............ *H01L 33/58* (2013.01); *H01L 25/167* (2013.01); *H01L 33/005* (2013.01); *H01S 5/026* (2013.01)

(58) Field of Classification Search
CPC ........ H01L 33/58; H01L 25/167; H01S 5/026
See application file for complete search history.

(56) References Cited

U.S. PATENT DOCUMENTS

| 2002/0182827 A1 | 12/2002 | Abe et al. |
| 2010/0059822 A1 | 3/2010 | Pinguet et al. |
| 2017/0031094 A1* | 2/2017 | Nakashiba ............. G02B 6/122 |

FOREIGN PATENT DOCUMENTS

| JP | 2001-210810 A | 8/2001 |
| JP | 2014-035546 A | 2/2014 |
| JP | 2017-032708 A | 2/2017 |

* cited by examiner

*Primary Examiner* — Jay C Chang
*Assistant Examiner* — Mikka Liu
(74) *Attorney, Agent, or Firm* — McDermott Will & Emery LLP

(57) ABSTRACT

A semiconductor device includes a substrate, an optical element, and a semiconductor element. The substrate includes a first region and a second region which are regions differing from each other. The optical element is formed in one of the first region and the second region. The electric element is formed in another of the first region and the second region. The first region includes a first insulating layer and a first semiconductor layer formed on the first insulating layer. The second region includes the first insulating layer, the first semiconductor layer, a second insulating layer formed on the first semiconductor layer, and a second semiconductor layer formed on the second insulating layer.

12 Claims, 16 Drawing Sheets

SEMICONDUCTOR DEVICE

CROSS-REFERENCE TO RELATED APPLICATIONS

The disclosure of Japanese Patent Application No. 2019-042173 filed on Mar. 8, 2019 including the specification, drawings and abstract is incorporated herein by reference in its entirety.

BACKGROUND

The present disclosure relates to a semiconductor device and method of manufacturing the semiconductor device, for example, a semiconductor device including an optical element and an electric element and method of manufacturing the semiconductor device.

There is a disclosed technique listed below.
[Patent Document 1] Japanese Unexamined Patent Application Publication No. 2014-035546

As an optical communication technique, a silicon photonics technique is known. In the silicon photonics technology, an optical element such as an optical waveguide, and an electrical element such as a transistor are formed in different semiconductor chips. A semiconductor chip including an optical element and a semiconductor chip including an electrical element are integrally assembled (for example, see Patent Document 1).

However, in a conventional method of manufacturing the semiconductor device, the manufacturing cost of the semiconductor device is high due to the assembling cost of the two semiconductor chips. For this reason, the semiconductor device disclosed in Patent Document 1 has room for improvements from the viewpoint of reducing the manufacturing costs of the semiconductor device.

A problem of the embodiments is to reduce the manufacturing costs of a semiconductor device. Other problems and novel features will become apparent from the description of the specification and drawings.

SUMMARY

A semiconductor device according to embodiments includes a substrate including a first region and a second region, the first region and the second region differing from each other, an optical element formed in one of the first region and the second region, and an electric element formed in another of the first region and the second region. The first region includes a first insulating layer and a first semiconductor layer. The second region includes the first insulating layer, the first semiconductor layer, the second insulating layer, and the second semiconductor layer.

A method of manufacturing the semiconductor device according to embodiments includes preparing a semiconductor wafer including a first insulating layer, a first semiconductor layer, a second insulating layer, and a second semiconductor layer, forming an optical element on the semiconductor wafer, and forming an electric element on the semiconductor wafer.

According to the embodiments, the manufacturing costs of the semiconductor device can be reduced.

DETAILED DESCRIPTION

Figure 1:
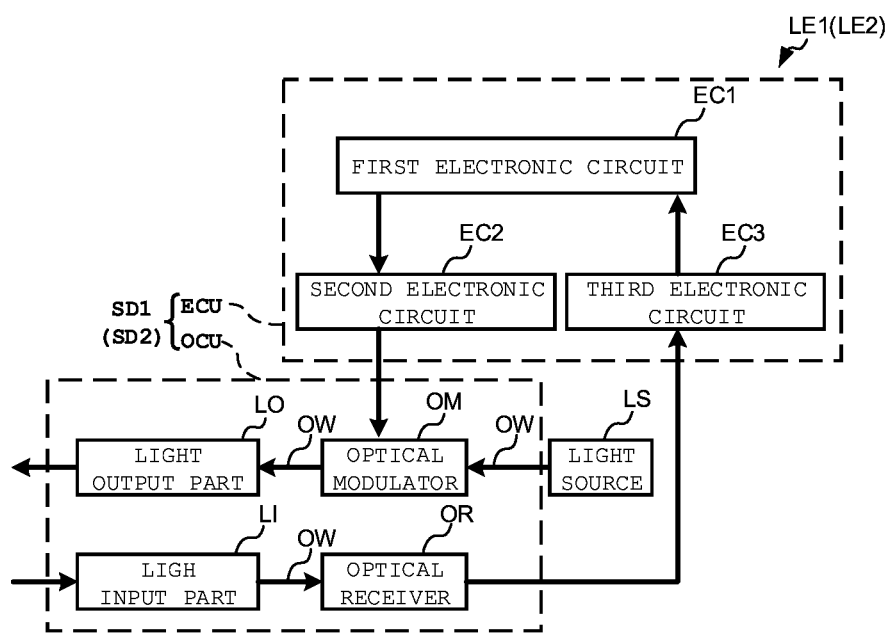
FIG. 1 is a block diagram showing an exemplary circuit configuration of an optoelectronic hybrid device according to first and second embodiments.

Hereinafter, a semiconductor device according to embodiments will be described in detail by referring to the drawings. In the specification and the drawings, the same or corresponding elements are denoted by the same reference numerals, and a repetitive description thereof is omitted. In the drawings, for convenience of description, a configuration may be omitted or simplified. A cross-sectional view may be shown as an end view. At least a portion of each embodiment and each modification may be arbitrarily combined with each other.

First Embodiment

In a semiconductor device SD1 according to a first embodiment, an optical element is formed in a first region R1 in which a semiconductor substrate SS, a first insulating layer IL1, and a first semiconductor layer SL1 are stacked in this order. An electric element is formed in a second region R2 in which the semiconductor substrate SS, the first insulating layer IL1, the first semiconductor layer SL1, a second insulating layer IL2, and a second semiconductor layer SL2 are stacked in this order.

(Circuit Configuration of Optoelectronic Hybrid Device)

FIG. 1 is a block diagram showing an exemplary circuit configuration of an optoelectronic hybrid device LE1 according to the first embodiment.

As shown in FIG. 1, the optoelectronic hybrid device LE1 includes a semiconductor device SD1 and a light source LS. The semiconductor device SD1 according to the first embodiment includes an optical circuit unit OCU and an electronic circuit unit ECU. The optical circuit unit OCU includes an optical waveguide OW, an optical modulator OM, a light output part LO, a light input part LI, and an optical receiver OR. The electronic circuit unit ECU includes a first electronic circuit EC1, a second electronic circuit EC2 and a third electronic circuit EC3. A configuration of the semiconductor device SD1 will be described in detail later.

The first electronic circuit EC1 outputs an electric signal for controlling the second electronic circuit EC2 and the third electronic circuit EC3, respectively. The first electronic circuit EC1 receives an electric signal outputted from the third electronic circuit EC3. The first electronic circuit EC1 is electrically coupled to the second electronic circuit EC2 and the third electronic circuit EC3. The first electronic circuit EC1 is formed of, for example, a known CPU (Central Processing Unit) or FPGA (Field-Programmable gate array) which include a control circuit and a storage circuit.

The light source LS emits light. Examples of types of the light source LS include laser diode. A wavelength of the light emitted from the light source LS may be set as appropriate in accordance with the material constituting the optical waveguide OW as long as the emitted light can pass through the inside of the optical waveguide OW. For example, the peak wavelength of the light emitted from the light source LS is 1.0 µm or more and 1.6 µm or less. The light source LS is optically connected to the optical modulator OM via the optical waveguide OW.

The second electronic circuit EC2 outputs an electric signal (control signal) for controlling the operation of the optical modulator OM. More specifically, the second electronic circuit EC2 controls the optical modulator OM based on the control signal received from the first electronic circuit EC1. The second electronic circuit EC2 is electrically coupled to the optical modulator OM. The second electronic circuit EC2 is constituted by, for example, a known transceiver integrated circuit including a control circuit.

The optical modulator OM modulates a phase of the light emitted from the light source LS based on the control signal received from the second electronic circuit EC2. The optical modulator OM generates an optical signal including information included in the control signal. Examples of the type of the optical modulator OM include a Mach-Zehnder type optical modulator and a ring type optical modulator. The optical modulator OM may be an electrically controlled optical modulator, a thermally controlled optical modulator, or a combined optical modulator using both electrical control and thermal control. The optical modulator OM is optically connected to the light output part LO via the optical waveguide OW.

The light output part LO outputs the optical signal modulated by the optical modulator OM to the outside of the semiconductor device SD1. For example, the light output part LO emits an optical signal toward an external optical fiber. Examples of types of light output part LOs include a grating coupler and a spot size converter. The light output part LO may be formed of the same material as the optical waveguide OW.

The light input part LI inputs an external light into the semiconductor device SD1. For example, an optical signal emitted from the external optical fiber is inputted into the semiconductor device SD1. Examples of types of light input part LI include a grating coupler and a spot size converter. The light input part LI is optically connected with the optical receiver OR via the optical waveguide OW. The light input part LI may be formed of the same material as the optical waveguide OW.

The optical receiver OR generates electron-hole pairs based on the optical signal received from the light input part LI. The optical receiver OR converts an optical signal into an electric signal. The optical receiver OR may have photoelectric conversion characteristics. Examples of the type of the optical receiver OR include an avalanche photodiode type optical receiver. The optical receiver OR is electrically coupled to the third electronic circuit EC3.

The third electronic circuit EC3 processes the electrical signal received from the optical receiver OR and outputs the processed electrical signal to the first electronic circuit EC1. More specifically, the third electronic circuit EC3 amplifies the electric signal received from the optical receiver OR and outputs the amplified electrical signal to the first electronic circuit EC1. The third electronic circuit EC3 is constituted by, for example, a known receiver integrated circuit including an amplifier circuit.

Next, an exemplary operation of the optoelectronic hybrid device LE1 according to the first embodiment will be described.

First, a transmission part of the optoelectronic hybrid device LE1 will be described. The light emitted from the light source LS reaches the optical modulator OM via the optical waveguide OW. The second electronic circuit EC2 controls the operation of the optical modulator OM based on the control signal received from the first electronic circuit EC1, and modulates the light reaching the optical modulator OM. As a result, an electric signal is converted into an optical signal. The optical signal reaches the light output part LO via the optical waveguide OW, and the optical signal is output to the outside of the semiconductor device SD1 in the light output part LO. The optical signal outputted from the semiconductor device SD1 are guided to another semiconductor device via an optical fiber or the like.

Next, a receiving part of the optoelectronic hybrid device LE1 will be described. An optical signal guided from another semiconductor device through an optical fiber or the like reaches the light input part LI. The optical signal is guided to the inside of the optical waveguide OW in the light input part LI. The optical signal reaches the optical receiver OR via the optical waveguide OW, and is converted into an electric signal. The electric signal is processed by the third electronic circuit EC3 and then transmitted to the first electronic circuit EC1.

(Configuration of Semiconductor Device)

Next, the configuration of the semiconductor device SD1 according to the first embodiment will be described.

Figure 2:
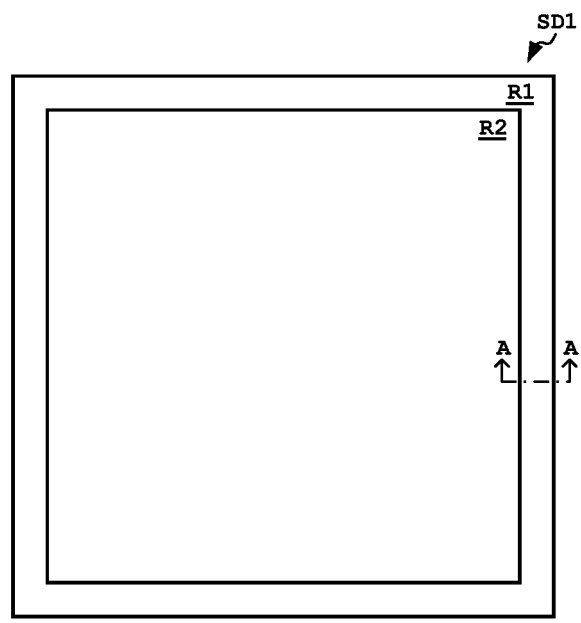
FIG. 2 is a plan view showing a semiconductor device according to the first embodiment.
Figure 3:
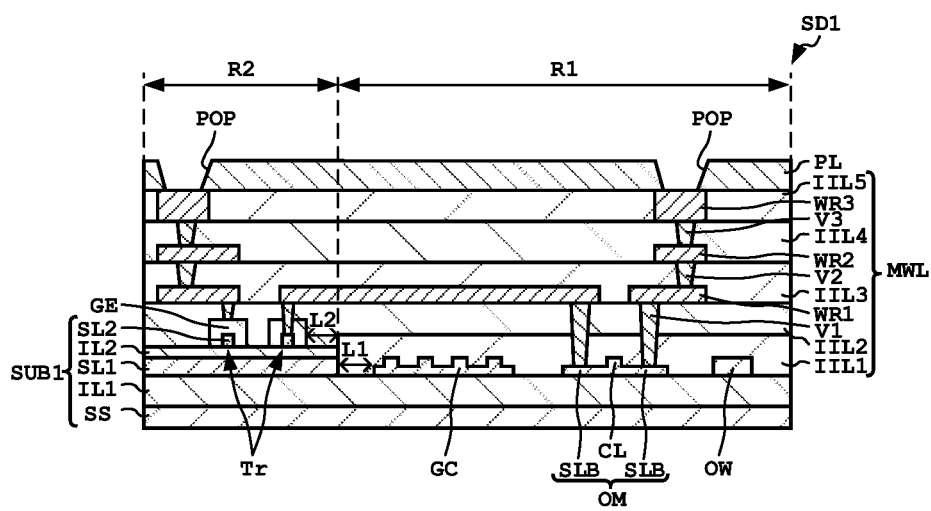
FIG. 3 is a cross-sectional view of a main portion of the semiconductor device according to the first embodiment.

FIG. 2 is a plan view showing the semiconductor device SD1. FIG. 3 is a cross-sectional view of a main portion of the semiconductor device SD1. FIG. 3 is a cross-sectional view taken along line A-A shown in FIG. 2.

As shown in FIG. 3, the semiconductor device SD1 includes a substrate SUB1, an optical waveguide OW, an optical modulator OM, a grating coupler GC, a transistor Tr, a multilayer wiring layer MWL, and a protective layer PL.

The substrate SUB1 is a support for supporting the optical element and the electric element. The substrate SUB1 includes a first region R1 and a second region R2, which are regions differing from each other. Examples of optical element include the optical waveguide OW, the optical modulator OM, and the grating coupler GC. Examples of the electrical element include the transistor Tr, a capacitance, an inductor, and a resistance. The electrical element includes an electrical element for controlling the operation of the optical element. In the first embodiment, the transistor Tr controls the operation of the optical modulator OM. Details of the optical element and the electrical element will be described later.

The first region R1 includes a semiconductor substrate SS, a first insulating layer IL1, and a first semiconductor layer SL1. The second region R2 includes the semiconductor substrate SS, the first insulating layer IL1, a first semiconductor layer SL1, a second insulating layer IL2, and a second semiconductor layer SL2. In the first embodiment, the optical circuit unit OCU including the optical element is formed on the first region R1 of the substrate SUB, and the electrical circuit unit ECU including the electrical element is formed on the second region R2 of the substrate SUB.

As shown in FIG. 2, in the first embodiment, the first region R1 surrounds the second region R2 in plan view. In other words, the first region R1 is disposed closer to an outer edge of the semiconductor device SD1 than the second region R2 in plan view. This makes it easier to guide the light from the optical waveguide OW to the external optical fiber or to guide the light from the external optical fiber to the inside of the optical waveguide OW from the viewpoint of layout design. In the plan view, the first region R1 may surround the second region R2 over the entire circumference, or may not surround the second region R2 over the entire circumference.

The semiconductor substrate SS is, for example, a monocrystalline silicon substrate containing impurities such as boron (B) and phosphorus (P). For example, the plane orientation of a main surface of the semiconductor substrate SS is (100), and the resistivity of the semiconductor substrate SS is 5 Ω·cm or more and 50 Ω·cm or less. A thickness of the semiconductor substrate SS is, for example, 100 µm or more and 900 µm or less.

The first insulating layer IL1 is formed on the semiconductor substrate SS. In the first embodiment, the first insulating layer IL1 directly contacts with an upper surface of the semiconductor substrate SS. The first insulating layer IL1 is a cladding layer for substantially confining the light propagating inside the optical waveguide OW to the inside of the optical waveguide OW. A material of the first insulating layer IL1 has a refractive index smaller than a refractive index of a material of the optical waveguide OW. The first insulating layer IL1 is formed of, for example, silicon oxide (SiO2). The refractive index of the material of the first insulating layer IL1 is, for example, 1.46. In this specification, the refractive index is a numerical value for light having a wavelength of 1.5 µm.

A thickness of the first insulating layer IL1 is preferably greater than a bleed-out distance of the light from the optical waveguide OW. From the viewpoint of reducing stresses applied to the semiconductor device SD1 and from the viewpoint of suppressing sticking of a semiconductor wafer by an electrostatic chuck during manufacturing of the semiconductor device SD1, the thickness of the first insulating layer IL1 is preferable small. The thickness of the first insulating layer IL1 may be greater or smaller than a thickness of the second insulating layer IL2. In the first embodiment, the thickness of the first insulating layer IL1 is greater than the thickness of the second insulating layer IL2.

For example, the thickness of the first insulating layer IL1 is 1 µm or more and 3 µm or less.

When the first insulating layer IL1 functions as a support, the semiconductor device SD1 may not include the semiconductor substrate SS. In this case, the first insulating layer IL1 is, for example, a sapphire substrate.

The first semiconductor layer SL1 is formed on the first insulating layer IL1. In the first embodiment, the first semiconductor layer SL1 is directly contacts with an upper surface of the first insulating layer IL1. In the first embodiment, the first semiconductor layer SL1 in the first region R1 constitutes all or a part of the optical element.

Examples of material of the first semiconductor layer SL1 include silicon (Si) and germanium (Ge). Examples of crystal structure of material of the first semiconductor layer SL1 include single crystal and polycrystalline. From the viewpoint of reducing light propagation losses in the optical element, the crystal structure of the material of the first semiconductor layer SL1 is preferably single crystal. The refractive index of the first semiconductor layer SL1 is, for example, 3.5. The first semiconductor layer SL1 may or may not contain impurities such as boron (B) and phosphorus (P), for example, depending on the type of the optical element constituting the optical circuit unit OCU.

The thickness of the first semiconductor layer SL1 may be appropriately adjusted in accordance with a size of the optical element. In the first embodiment, the thickness of the first semiconductor layer SL1 is smaller than the thickness of the semiconductor substrate SS. The thickness of the first semiconductor layer SL1 is, for example, 200 nm or more and 300 nm or less.

The second insulating layer IL2 is formed on a portion of the first semiconductor layer SL1 located in the second region R2. In the first embodiment, the second insulating layer IL2 directly contacts with an upper surface of the portion of the first semiconductor layer SL1 located in the second region R2. A thickness of the second insulating layer IL2 is not particularly limited, and is, for example, 100 nm or more and 200 nm or less. The second insulating layer IL2 is formed of, for example, silicon oxide (SiO2).

The second semiconductor layer SL2 is formed on the second insulating layer IL2. In the first embodiment, the second semiconductor layer SL2 directly contacts with an upper surface of the second insulating layer IL2. In the first embodiment, the second semiconductor layers SL2 constitute the electric element included in the electric circuit unit ECU.

Examples of material of the second semiconductor layer SL2 include silicon (Si) and germanium (Ge). The crystal structure of the material of the second semiconductor layer SL2 is single crystal. The second semiconductor layer SL2 may contain impurities such as boron (B) and phosphorus (P), for example, in accordance with the type of the electric element constituting the electric circuit unit ECU. The thickness of the second semiconductor layer SL2 may be similar to the thickness of the semiconductor substrate SS and the thickness of the first semiconductor layer SL1. The thickness of the second semiconductor layer SL2 may be greater or smaller than the thickness of the semiconductor substrate SS and the thickness of the first semiconductor layer SL1. In the first embodiment, the thickness of the second semiconductor layer SL2 is smaller than the thickness of the semiconductor substrate SS and the thickness of the first semiconductor layer SL1. The thickness of the second semiconductor layer SL2 is, for example, 50 nm or more and 100 nm or less.

A step difference formed at the border between the first region R1 and the second region R2, and formed by the first semiconductor layer SL1 and the second insulating layer IL2 is smaller than the size of the semiconductor device SD1. The effect of the step in manufacturing the semiconductor device SD1 can be ignored.

The optical waveguide OW is a path through which light can propagate. The optical waveguide OW is formed on the first insulating layer IL1. As the configuration of the optical waveguide OW, a configuration known as an optical waveguide in the silicon photonics technology can be adopted. For example, the optical waveguide OW has a width of 300 nm or more and 500 nm or less, and a thickness of 200 nm or more and 300 nm or less. The cross-sectional shape of the optical waveguide OW is a rectangular shape or a trapezoidal shape. As described above, the optical waveguide OW is formed of the first semiconductor layer SL1.

The optical modulator OM is a Mach-Zehnder type optical modulator for changing the phase of light traveling inside the optical modulator OM. The optical modulator OM is formed on the first insulating layer IL1. As a structure of the optical modulator OM, a structure known as a optical modulator in the silicon photonics art can be adopted. In the first embodiment, the optical modulator OM includes a core layer CL functioning as an optical waveguide, and a pair of slab portions SLB formed such that the pair of slab portions SLB sandwich the core layer CL. As described above, the optical modulator OM is formed by the first semiconductor layer SL1. The core layer CL and the slab portions SLB contain predetermined impurities.

The grating coupler GC inputs light into the inside of the optical waveguide OW, and outputs light to the outside of the optical waveguide OW. The grating coupler GC is formed on the first insulating layer IL1. As the configuration of the grating coupler GC, a configuration known as a grating coupler in silicon photonics technology can be adopted. For example, the grating coupler GC is an optical waveguide whose upper surface has a concavo-convex shape. As described above, the grating coupler GC is also formed by the first semiconductor layer SL1.

A distance L1 between the optical element formed in the first region R1 and a side surfaces of the first semiconductor layer SL1 located at the boundary between the first region R1 and the second region R2 in the direction along the main surface (in-plane direction) of the semiconductor substrate SS is preferably 30 μm or more (see FIG. 3). Thus, for example, in a step of forming the electric element in the second region R2, it is possible to suppress the optical element formed in the first region R1 in advance from being damaged. The distance L1 is the shortest distance between the optical element formed closest to the second region R2 among the optical elements formed in the first region R1, and the portion of the first semiconductor layer SL1 located at the boundary between the first region R1 and the second region R2.

The transistor Tr is formed on the second insulating layer IL2. As the structure of the transistor Tr, a structure known as a transistor in the semiconductor technology can be adopted. Examples of the transistor Tr include a field-effect transistor such as a FinFET and a planar MISFET. In the first embodiment, the transistor Tr is a FinTET. The transistor Tr includes a protrusion including source/drain regions, a gate dielectric film formed to cover a portion of the protrusion, and a gate electrode GE formed on the gate dielectric film. The protrusion of the transistor Tr is formed of the second semiconductor layer SL2.

As shown in FIG. 3, a distance L2 between the electric element formed in the second region R2 and the side surfaces of the first semiconductor layer SL1 located at the boundary between the first region R1 and the second region R2 in the direction along the main surface of the semiconductor substrate SS is preferable 30 μm or more. Thus, for example, in the step of forming the electric element in the second region R2, it is possible to suppress the optical element formed in the first region R1 in advance from being damaged. The distance L2 is a distance between the electric element formed closest to the first region R1 among the electric elements formed in the second region R2, and a portion of the first semiconductor layer SL1 located at the boundary between the first region R1 and the second region R2.

The multilayer wiring layer MWL is a layer constituted by two or more wiring layers. The multilayer wiring layer MWL is formed on substrate SUB. The wiring layer is a layer including an interlayer insulating layer and one or both of a wiring and a via (also referred to as "plugs") formed in the interlayer insulating layer. The via is a conductive member electrically connecting two wiring formed in layers which are different from each other.

The multilayer wiring layer MWL includes a first interlayer insulating layer IIL1, a second interlayer insulating layer IIL2, a first via V1, a first wiring WR1, a third interlayer insulating layer IIL3, a second via V2, a second wiring WR2, a fourth interlayer insulating layer IIL4, a third via V3, a third wiring WR3, and a fifth interlayer insulating layer IIL5.

The first interlayer insulating layer IIL1 is formed on the substrate SUB1 such that the first interlayer insulating layer IIL1 covers the optical waveguide OW, the optical modulator OM, and the grating coupler GC. The materials of the first interlayer insulating layer IIL1 include, for example, silicon oxide (SiO2). The refractive index of the first interlayer insulating layer IIL1 is, for example, 1.46.

The second interlayer insulating layer IIL2 is formed on the second insulating layer IL2 and the first interlayer insulating layer IIL1 such that the second interlayer insulating layer IIL2 covers the transistor Tr. The second interlayer insulating layer IIL2 is formed of, for example, silicon oxide (SiO2).

From the viewpoint of suppressing scattering of light seeping out of the optical waveguide OW by the wiring formed on the second interlayer insulating layer IIL2, in the first region R1, a total thickness of the first interlayer insulating layer IIL1 and the second interlayer insulating layer IIL2 is preferably 1 μm or more and 5 μm or less, and more preferably 2 μm or more and 3 μm or less.

The first via V1 electrically connects the slab portion SLB of the optical modulator OM and the first wiring WR1 in the first region R1 with each other. The first via V1 electrically connects the source/drain region and the gate electrode of the transistor Tr, and the first wiring WR1 in the second region R2 with each other. As the configuration of the first via V1, a configuration known as a via in the semiconductor technology can be adopted. For example, the first via V1 is, for example, a stacked film formed by a barrier metal and a conductive film formed on the barrier metal. Examples of material for the barrier metal include titanium (Ti), titanium nitride (TiN), tantalum (Ta), and tantalum nitride (TaN). The material of the conductive film is, for example, tungsten (W).

As the first wiring WR1, a structure known as a wiring in the semiconductor technology can be adopted. In the first embodiment, the first wiring WR1 electrically connects the transistor Tr and the optical modulator OM via the first via V1 with each other. The first wiring WR1 is, for example, a stacked film in which a first barrier metal, a conductive film, and a second barrier metal are formed in this order. Examples of material of the first barrier metal and the second barrier metal include titanium (Ti), titanium nitride (TiN), tantalum (Ta), and tantalum nitride (TaN). Examples of the material of the conductive film include aluminum (Al) and copper (Cu).

The third interlayer insulating layer IIL3 is formed on the second interlayer insulating layer IIL2. The third interlayer insulating layer IIL3 is formed of, for example, silicon oxide (SiO2). The thickness of the third interlayer insulating layer IIL3 is, for example, 0.8 μm or more and 1.2 μm or less.

The second via V2 electrically connects the first wiring WR1 and the second wiring WR2 with each other. As the configuration of the second via V2, a configuration known as a via in the semiconductor technology can be adopted. For example, the material of the second via V2 is, for example, a stacked film formed by a barrier metal and a conductive film formed on the barrier metal. Examples of material for the barrier metal include titanium (Ti), titanium nitride (TiN), tantalum (Ta), and tantalum nitride (TaN). Examples of the material of the conductive film include tungsten (W), aluminum (Al), and copper (Cu).

The second wiring WR2 may employ a configuration known as a wiring in the semiconductor technology. Examples of the configuration of the second wiring WR2 are similar to those of the first wiring WR1.

The fourth interlayer insulating layer IIL4 is formed on the third interlayer insulating layer IIL3. The configuration of the fourth interlayer insulating layer IIL4 is similar to that of the third interlayer insulating layer IIL3.

The third via V3 electrically connects the second wiring WR2 and the third wiring WR3. As the configuration of the third via V3, a configuration known as a via in the semiconductor technology can be adopted. An example of the configuration of the third via V3 is similar to that of the second via V2.

The third wiring WR3 may employ a configuration known as a wiring in the semiconductor technology. Examples of the configuration of the third wiring WR3 are similar to that of the first wiring WR1.

The fifth interlayer insulating layer IIL5 is formed on the fourth interlayer insulating layer IIL4. The structure of the fifth interlayer insulating layer IIL5 is similar to that of the third interlayer insulating layer IIL3.

The protective layer PL is formed on the fifth interlayer insulating layer IIL5. The protective layer PL may protect the semiconductor device SD1. Example of material for the protective layer PL includes silicon oxide, silicon oxynitride, silicon nitride, and PSG (Phospho Silicate Glass). A thickness of the protective layer PL is, for example, 0.3 μm or more and 0.7 μm or less. A part of the third wiring WR3 is exposed inside the pad opening POP formed in the protective layer PL.

The pad opening POP is formed in the protective layer PL to expose the third wiring WR3 to the outside of the protective layer PL. The exposed portion of the third wiring WR3 is configured to be connected to an external wiring such as a bonding wire, for example. From the viewpoint of suppressing damage to the semiconductor device SD1, which may be caused by an impact when the external wiring is connected to the third wiring WR3, it is preferable that the pad opening POP is located in a region which differs from the optical element and the electric element in plan view. In other words, the pad opening POP is preferably formed without overlapping with the optical element and the electrical element in plan view.

(Method of Manufacturing Semiconductor Device)

Next, an exemplary method of manufacturing the semiconductor device SD1 according to the first embodiment will be described. FIGS. 4 to 10 are cross-sectional views showing examples of steps included in the method of manufacturing the semiconductor device SD1.

The method of manufacturing the semiconductor device SD1 according to the first embodiment includes (1) providing a semiconductor wafer SW, (2) forming the first region R1 and the second region R2, (3) forming the optical element, (4) forming the first interlayer insulating layer IIL1, (5) forming the electric element, (6) forming the multilayer wiring layer MWL, and (7) forming the protective layer PL.

(1) Providing the Semiconductor Wafer

Figure 4:
FIG. 4 is a cross-sectional view showing an exemplary step included in the method of manufacturing the semiconductor device according to the first embodiment.

First, as shown in FIG. 4, the semiconductor wafer SW in which the semiconducting substrate SS, the first insulating layer IL1, the first semiconductor layer SL1, the second insulating layer IL2, and the second semiconductor layer SL2 are stacked in this order is provided.

The semiconductor wafer SW may be manufactured or purchased as a commercial product. The method of manufacturing the semiconductor wafer SW can be appropriately selected from a known manufacturing method. For example, the semiconductor wafer SW may be manufactured by methods described in Japanese Unexamined Patent Application Publication No. 2017-032708 and Japanese Unexamined Patent Application Publication No. 2001-210810.

(2) Forming the First Region R1 and the Second Region R2

Figure 5:
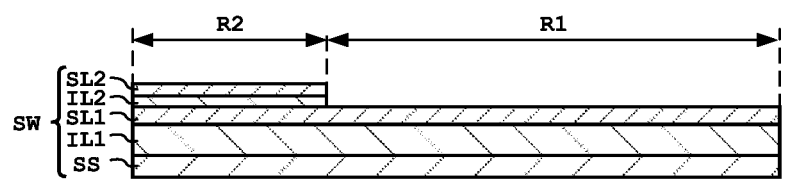
FIG. 5 is a cross-sectional view showing an exemplary step included in the method of manufacturing the semiconductor device according to the first embodiment.

And then, as shown in FIG. 5, the second insulating layer IL2 and a portion of the second semiconductor layer SL2 are removed. Thus, the first region R1 in which the semiconductor substrate SS, the first insulating layer IL1, and the first semiconductor layer SL1 are stacked in this order, and the second region R2 in which the semiconductor substrate SS, the first insulating layer IL1, the first semiconductor layer SL1, second insulating layer IL2, and the second semiconductor layer SL2 are formed in this order are formed. The second insulating layer IL2 and the second semiconductor layer SL2 are removed by, for example, photolithography technique and etching method.

(3) Forming the Optical Element

Figure 6:
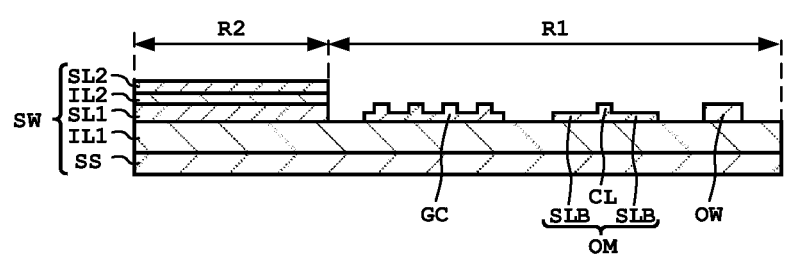
FIG. 6 is a cross-sectional view showing an exemplary step included in the method of manufacturing the semiconductor device according to the first embodiment.

Next, as shown in FIG. 6, portions of the first semiconductor layer SL1 located in the first region R1 are processed to form the optical elements. In the first embodiment, the optical waveguide OW, the optical modulator OM, and the grating coupler GC are formed. Specifically, first, as shown in FIG. 6, a portion of the first semiconductor layer SL1 is patterned. The first semiconductor layer SL1 is patterned by, for example, a photolithography technique and an etching method. As a result, the optical waveguide OW and the grating coupler GC are formed. Further, a desired impurity is implanted into the first semiconductor layer SL1 constituting the optical modulator OM by photolithography and ion implantation. As a result, the optical modulator OM is formed. In the step of forming the optical element, heat treatment may be performed as necessary.

(4) Forming the First Interlayer Insulating Layer IIL1

Figure 7:
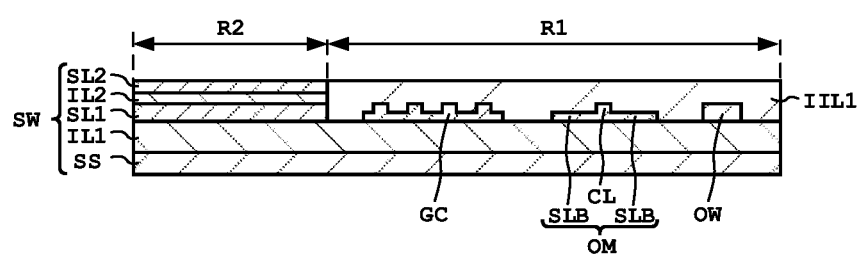
FIG. 7 is a cross-sectional view showing an exemplary step included in the method of manufacturing the semiconductor device according to the first embodiment.

Next, as shown in FIG. 7, the first interlayer insulating layer IIL1 constituting a part of the multilayer wiring layer MWL is formed. More specifically, the first interlayer insulating layer IIL1 is formed on the semiconductor wafer SW so as to cover the optical elements in the first region R1. In the first embodiment, the first interlayer insulating layer IIL1 is formed on the semiconductor wafer SW so as to expose the second semiconductor layer SL2 in the second region R2. For example, after the first interlayer insulating layer IIL1 is formed on the semiconductor wafer SW, the first interlayer insulating layer IIL1 may be polished so that the third semiconductor layer SL3 is exposed from the first interlayer insulating layer IIL1. The method of forming the first interlayer insulating layer IIL1 is, for example, a CVD method. Examples of the method of polishing the first interlayer insulating layer IIL1 include a CMP method. Note that a wet etching method may be used instead of the CMP method.

(5) Forming the Electric Element

Figure 8:
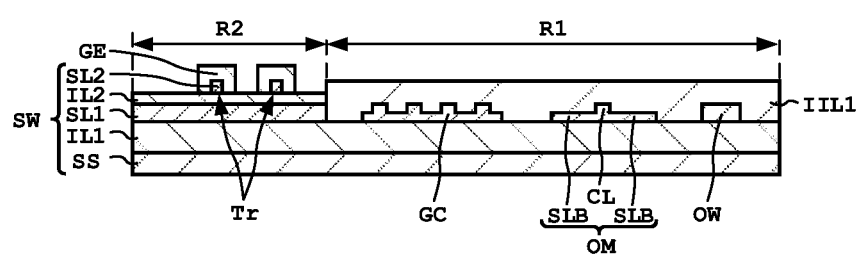
FIG. 8 is a cross-sectional view showing an exemplary step included in the method of manufacturing the semiconductor device according to the first embodiment.

Next, as shown in FIG. 8, the second semiconductor layer SL2 located in the second region R2 is processed to form electrical elements. In the first embodiment, the FinFET is formed as the electric element. The method of forming the electric element can be formed in the same manner as a known method of forming the electric element in the semiconductor technology. For example, first, the second semiconductor layer SL2 is patterned. The second semiconductor layer SL2 is patterned by, for example, a photolithography technique and an etching method. Next, although not particularly illustrated, desired impurities are implanted into regions to be the source region and the drain region. In this instance, heat treatment is also performed as necessary. Next, after the patterning, a gate dielectric film (not shown) covering a part of the protrusion which is the second semiconductor layer SL2, and the gate electrodes GE are formed in this order. The method of forming the gate dielectric film is, for example, a CVD method. The gate electrode GE is formed by, for example, a sputtering method.

(5) Forming the Multilayer Wiring Layer MWL

Figure 9:
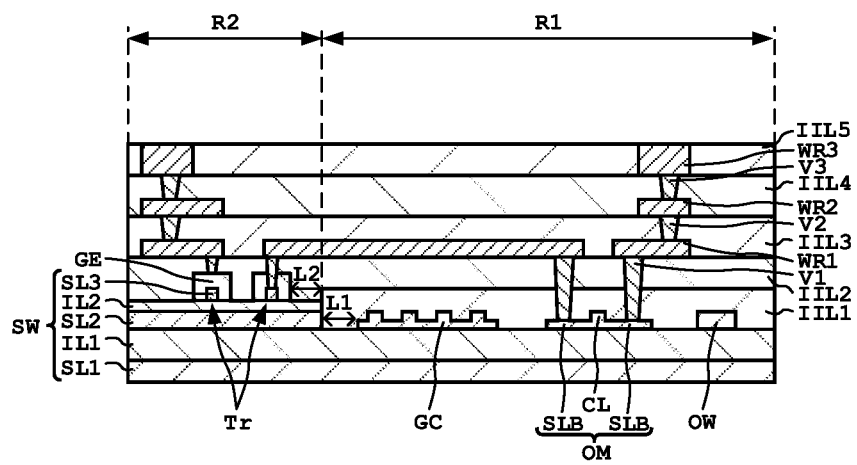
FIG. 9 is a cross-sectional view showing an exemplary step included in the method of manufacturing the semiconductor device according to the first embodiment.

Next, as shown in FIG. 9, the multilayer wiring layer MWL for electrically connecting the optical modulator OM and the transistor Tr with each other is formed on the semiconductor wafer SW. The forming the multilayer wiring layer MWL includes, for example, forming the second interlayer insulating layer IIL2, the first via V1, the first wiring WR1, third interlayer insulating layer IIL3, the second via V2, the second wiring WR2, the fourth interlayer insulating layer IIL4, the third via V3, the third wiring WR3, and the fifth interlayer insulating layer IIL5.

Each of the second interlayer insulating layer IIL2, the third interlayer insulating layer IIL3, the fourth interlayer insulating layer IIL4, and the fifth interlayer insulating layer IIL5 may be formed in the same manner as the first interlayer insulating layer IIL1. Each of the first via V1, the second via V2, and the third via V3 may be formed in a manner similar to that known in the art for forming vias. Each of the first wiring WR1, second wiring WR2 and third wiring WR3 may be formed in a manner similar to known methods of forming a wiring in the semiconducting arts.

(6) Forming the Protective Layer PL

Figure 10:
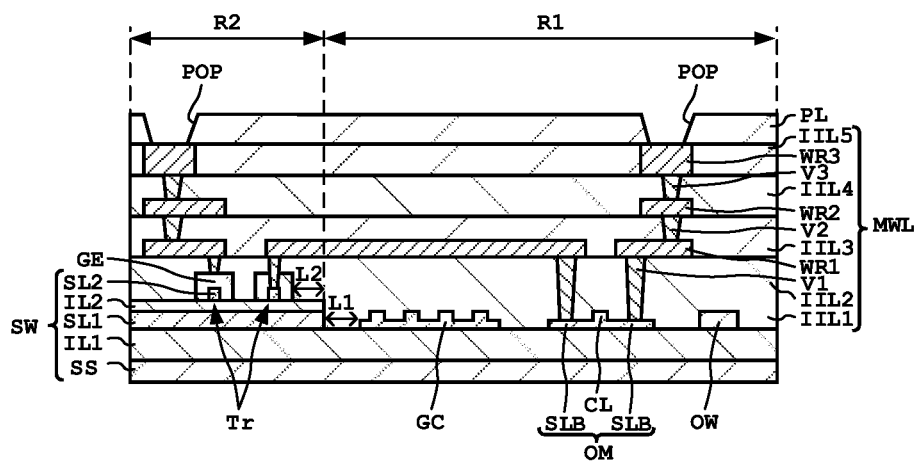
FIG. 10 is a cross-sectional view showing an exemplary step included in the method of manufacturing the semiconductor device according to the first embodiment.

Next, as shown in FIG. 10, the protective layer PL is formed on the fifth interlayer insulating layer IIL5. The method of forming the protective layer PL is not particularly limited, and may be appropriately selected from known methods. Next, a portion of the protective layer PL located on the third wiring WR3 is removed. As a result, the pad opening POP exposing a portion of the third wiring WR3 may be formed in the protective layer PL.

Finally, a plurality of singulated semiconductor devices SD1 are obtained by dicing the semiconductor wafer SW. That is, the semiconductor wafer SW in FIG. 10 is singulated to obtain the semiconductor device SD1 having the substrate SUB1 as shown in FIG. 3.

By the above manufacturing method, the semiconductor device SD1 according to the first embodiment can be manufactured. The method of manufacturing the semiconductor device SD1 according to the first embodiment may further include other steps as required. Examples of other steps include, for example, arranging laser diode as the light sources and forming a optical receiver. The other steps may be suitably adopted from the methods known in the silicon photonics technology.

In the first embodiment, the forming the optical element is performed prior to the forming the electrical element, but the forming the optical element may be performed after the forming the electrical element. From the viewpoint of preventing the characteristic of the electric element from being affected by the heat treatment in the forming the optical element, it is preferable that the forming the electric element is performed after the forming the optical element. As a result, the characteristics of both the optical element and the electrical element can be compatible with each other.

(Examined Example)

Figure 11:
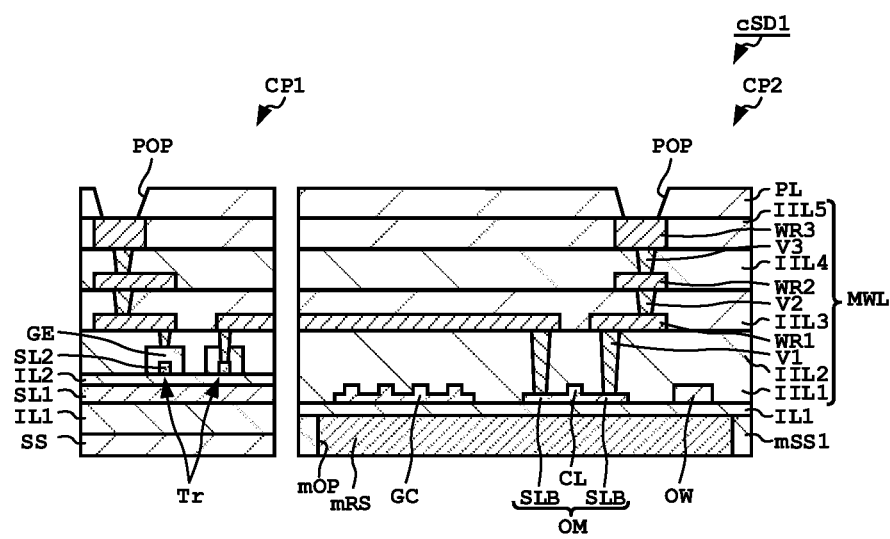
FIG. 11 is a cross-sectional view showing an exemplary configuration of a semiconductor device according to an examined example.

Here, in order to explain the characteristics of the semiconductor device SD1 according to the first embodiment, the semiconductor device cSD1 according to the examined example will be described. FIG. 11 is a cross-sectional view showing an exemplary configuration of a main portion of the semiconductor device cSD1. The semiconductor device cSD1 includes a first chip CP1 in which an electric element is formed, and a second chip CP2 in which an optical element is formed. The semiconductor device cSD1 is manufactured by separately manufacturing each of the first chip CP1 and the second chip CP2 and then assembling the two chips CP1 and CP2. The semiconductor device cSD1 includes a semiconductor substrate mSS1 having an opening mOP formed therein. A resin layer mRS is formed in the opening mOP. The resin layer mRS will be described later in detail (see first modified example of first embodiment).

On the other hand, the semiconductor device according to the first embodiment is manufactured using a semiconductor wafer SW in which the first insulating layer IL1, the first semiconductor layer SL1, the second insulating layer IL2, and the second semiconductor layer SL2 are stacked in this order. Thereby, the optical element and the electric element can be formed on one substrate SUB1. Thus, compared to the semiconductor device cSD1 according to the examined example, the cost of assembling is suppressed, and as a result, the manufacturing cost of the semiconductor device is reduced.

(Effect)

In the semiconductor device SD1 according to the first embodiment, the optical element and the electric element are mixed on one substrate SUB1. Thus, according to the first embodiment, manufacturing costs can be reduced as compared with a case that a semiconductor chip including an optical element and a semiconductor chip including an electric element are assembled to manufacture a semiconductor device.

First Modification of First Embodiment

Figure 12:
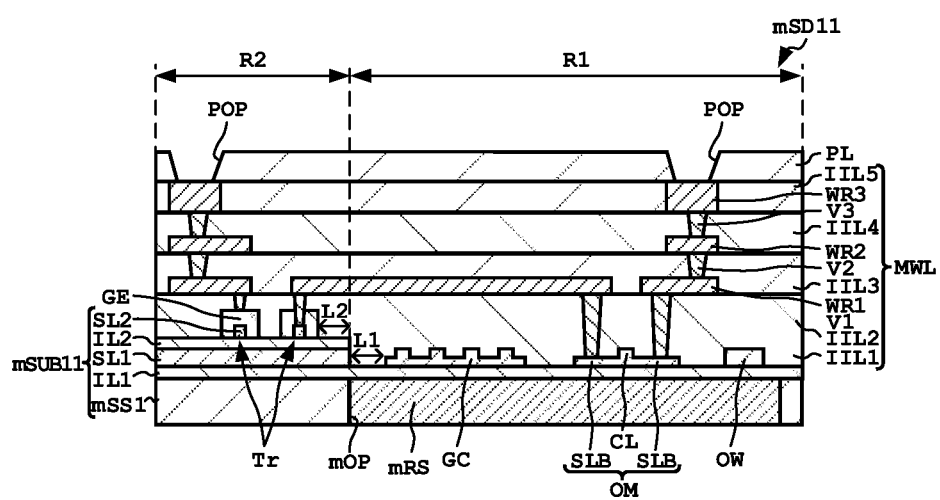
FIG. 12 is a cross-sectional view showing an exemplary configuration of a main portion of a semiconductor device according to a first modification of the first embodiment.

FIG. 12 is a cross-sectional view showing an exemplary configuration of a main portion of a semiconductor device mSD11 according to a first modification of the first embodiment.

As shown in FIG. 12, in the semiconductor device mSD11 according to the first modification, an opening mOP is formed on the back surface of a substrate mSUB11. The opening mOP penetrates through the semiconductor substrate mSS1. The first insulating layer IL1 is exposed at a bottom of the opening mOP. The opening mOP is formed in the semiconductor substrate mSS1 such that the opening mOP overlaps with the optical elements such as the optical waveguide OW, the optical modulator OM, and the grating coupler GC in plan view. As a result, the leaked light from the optical element is not scattered by the semiconductor substrate mSS1.

The resin layer may or may not be formed in the opening mOP. From the viewpoint of increasing the strength of the semiconductor device mSD11, it is preferable that the resin layer is formed in the opening mOP. In the first modification, the resin layer mRS is formed in the opening mOP.

Examples of the method of forming the opening mOP include a dry etching method and a wet etching method. Examples of etchant used in the wet etching include aqueous potassium hydroxide (KOH), aqueous tetramethylammonium hydroxide (TMAH), aqueous ethylenediamine pyrocatechol (EDP), aqueous hydrazine (N2H), aqueous sodium hydroxide, and aqueous cesium hydroxide (CsOH).

When the opening mOP is formed by the wet etching method, the etching rate differs in accordance with the crystallographic orientation of the semiconductor substrate mSS1. The degree of freedom in design can be enhanced by forming the opening mOP so that the longitudinal axis direction of the opening mOP and the extending direction of the optical waveguide OW coincide with each other in plan view. From this viewpoint, the difference between the crystal orientation of the first semiconductor layer SL1 and the crystal orientation of the second semiconductor layer SL2 and the crystal orientation of the semiconductor substrate mSS1 is preferably 40° or more and 50° or less, more preferably about 45°.

In addition, from the viewpoint of increasing the carrier mobility in the optical modulator OM, it is preferable that the widthwise direction of the optical waveguide OW in the optical modulator OM is along the crystallographic direction of the first semiconductor layer SL1. Further, from the viewpoint of increasing the carrier mobility in the transistor Tr, it is preferable that the crystallographic direction of the channels in the transistor Tr is along the crystallographic direction <100> of the second semiconductor layer SL2.

The resin layer mRS may function as a cladding layer. That is, a material of the resin layer mRS may have a refractive index smaller than the refractive index of the material of the optical waveguide OW. For example, the refractive index of the material of the resin layer mRS is 1.3 or more and 1.7 or less. The resin layer mRS is formed of polyimide, for example.

The method of forming the resin layer mRS is not particularly limited. Examples of method of forming the resin layer mRS include lithography, mosquito, and nanoimprinting methods. For example, the resin layer mRS may be formed by providing the curable composition constituting the resin layer mRS in the opening mOP and then curing the curable composition. The curable composition may be a thermosetting composition or a photocurable composition.

In the semiconductor device mSD11 according to the first modification, instead of the first insulating layer IL1, the resin layer mRS formed in the opening mOP of the first semiconductor layer mSL1 functions as a cladding layer of the optical waveguide OW. Therefore, the thickness of the first insulating layer IL1 may be small. For example, the thickness of the first insulating layer IL1 is 500 nm or more and 1 μm or less. As a result, it is possible to suppress sticking of the semiconductor wafer SW by the electrostatic chuck during manufacturing of the semiconductor device mSD11. As a result, the semiconductor device mSD11 can be manufactured with a higher yield.

Second Modification of First Embodiment

Figure 13:
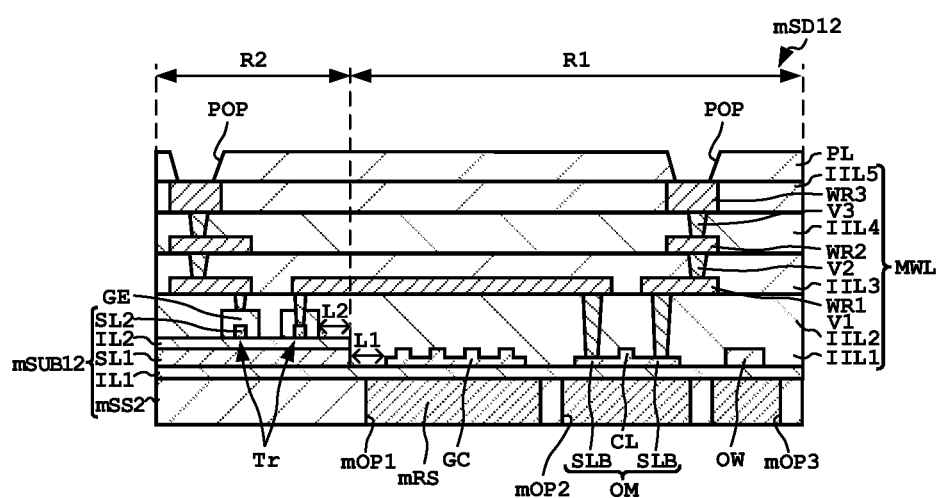
FIG. 13 is a cross-sectional view showing an exemplary configuration of a main portion of a semiconductor device according to a second modification of the first embodiment.

FIG. 13 is a cross-sectional view showing an exemplary configuration of a main portion of the semiconductor device mSD12 according to a second modification of the first embodiment.

As shown in FIG. 13, in the semiconductor device mSD12 according to the second modification, three openings mOP1, mOP2 and mOP3 are formed on the back surface of a substrate mSUB12. In the second modification, each of the three openings mOP1, mOP2 and mOP3 penetrates through the semiconductor substrate mSS2. The first insulating layer IL1 is exposed at the bottom of each of the three openings mOP1, mOP2 and mOP3. The respective openings are formed in the semiconductor substrate mSS2 such that the respective openings overlap with the optical element in plan view. In the second modification, in plan view, the first opening mOP1 overlaps with the grating coupler GC, the second opening mOP2 overlaps with the optical modulator OM, and the third opening mOP3 overlaps with the optical waveguide OW. This makes it difficult for the leaked light from the optical elements to be scattered by the semiconductor substrate mSS2. In addition, in the semiconductor device mSD12, a part of the semiconductor substrate mSS2 remains between two adjacent openings. As a result, the strength of the semiconductor substrate mSS2 is greater than that of the semiconductor device mSD11 according to the first modification.

Second Embodiment

In the semiconductor device SD2 according to a second embodiment, the optical device is formed in the second region R2 in which a semiconductor substrate SS, a second insulating layer IL2, a second semiconductor layer SL2, a first insulating layer IL1, and a first semiconductor layer SL1 are stacked in this order. An electric element is formed in the first region R1 in which the semiconductor substrate SS, the second insulating layer IL2, and the second semiconductor layer SL2 are stacked in this order.

In an optoelectronic hybrid device LE2 and the semiconductor device SD2 according to the second embodiment, only the configuration of the substrate SUB2 differs from the optoelectronic hybrid device LE1 and the semiconductor device SD1 according to the first embodiment. Therefore, the same or corresponding constituent elements as those of the optoelectronic hybrid device LE1 and the semiconductor device SD1 according to the first embodiment are denoted by the same reference numerals, and descriptions thereof are omitted.

Figure 14:
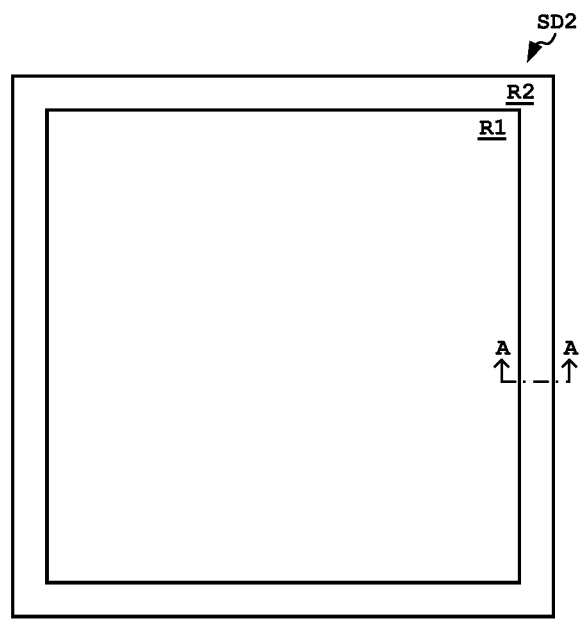
FIG. 14 is a plan view showing a semiconductor device according to a second embodiment.
Figure 15:
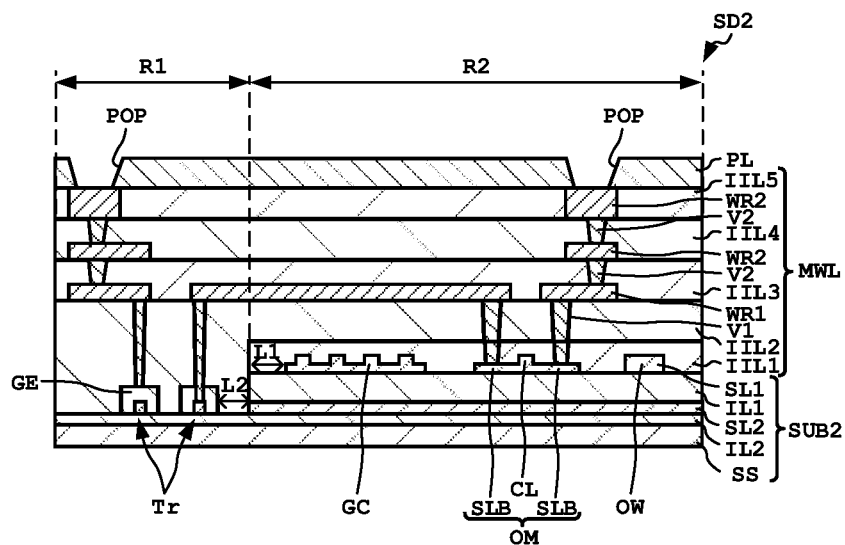
FIG. 15 is a cross-sectional view showing a main portion of the semiconductor device according to the second embodiment.

FIG. 1 is a block diagram showing an exemplary circuit configuration of a optoelectronic hybrid device LE2 according to the second embodiment. FIG. 14 is a plan view of the semiconductor device SD2. FIG. 15 is a cross-sectional view showing a main portion of the semiconductor device SD2. FIG. 15 is a cross-sectional view taken along line A-A shown in FIG. 14.

As shown in FIG. 1, the optoelectronic hybrid device LE2 includes the semiconductor device SD2 and a light source LS. The semiconductor device SD2 according to the second embodiment includes an optical circuit unit OCU and an electric circuit unit ECU.

As shown in FIG. 15, the semiconductor device SD2 includes a substrate SUB2, an optical waveguide OW, an optical modulator OM, a grating coupler GC, a transistor Tr, a multilayer wiring layer MWL, and a protective layer PL.

The substrate SUB2 includes a first region R1 and a second region R2, which are regions differing from each other. In the second embodiment, the first region R1 includes semiconductor substrate SS, second insulating layer IL2 and second semiconductor layer SL2. The second region R2 includes the semiconductor substrate SS, the second insulating layer IL2, the second semiconductor layer SL2, the first insulating layer IL1, and the first semiconductor layer SL1. In the second embodiment, the optical circuit unit OCU including the optical element is formed in the second region R2 of the substrate SUB, and the electrical circuit unit ECU including the electrical element is formed in the first region R1 of the substrate SUB.

As shown in FIG. 14, in the second embodiment, the second region R2 surrounds the first region R1 in plan view. In other words, the second region R2 is disposed closer to the outer edge of the semiconductor device SD2 than the first region R1 in plan view. This makes it easier to guide the light from the optical waveguide OW to the external optical fiber or to guide the light from the external optical fiber to the inside of the optical waveguide OW from the viewpoint of layout design. In the plan view, the second region R2 may surround the first region R1 over the entire circumference, or may not surround the first region R1 over the entire circumference.

The second insulating layer IL2 is formed on the semiconductor substrate SS. In second embodiment, the second insulating layer IL2 directly contacts with an upper surface of the semiconductor substrate SS.

The first insulating layer IL1 is formed on a portion of the second semiconductor layer SL2 located in the second region R2. In the first embodiment, the first insulating layer IL1 directly contacts with an upper surface of the portion of the second semiconductor layer SL2 located in the second region R2.

As shown in FIG. 15, a distance L1 between the optical element formed in the second region R2, and the side surfaces of the second semiconductor layer SL2 located at the boundary between the first region R1 and the second region R2 in the direction along a main surface of the semiconductor substrate SS (in-plane direction) is preferably 30 μm or more. The distance L1 is the shortest distance between the optical element formed closest to the first region R1 in the optical element formed in the second region R2 and the portion of the second semiconductor layer SL2 located at the boundary between the first region R1 and the second region R2. Thus, for example, in the step of forming the electric element in the second region R2, it is possible to suppress the optical element formed in the first region R1 in advance from being damaged.

As shown in FIG. 15, a distance L2 between the electric element formed in the first region R1, and the side surface of the second semiconductor layer SL2 located at the boundary between the first region R1 and the second region R2 in the directions along the main surface of the semiconductor substrate SS is preferable 30 μm or more. Thus, for example, in the process of forming the electric element in the second region R2, it is possible to suppress the optical element formed in the first region R1 in advance from being damaged. The distance L2 is a distance between an electric element formed closest to the second region R2 of the electric elements formed in the first region R1 and a side surface of a portion of the second semiconductor layer SL2 located at the boundary between the first region R1 and the second region R2.

(Method of Manufacturing Semiconductor Device)

Next, an exemplary method of manufacturing the semiconductor device SD2 according to the second embodiment will be described. The method of manufacturing the semiconductor device SD2 according to the second embodiment includes (1) providing the semiconductor wafer SW, (2) forming the first region R1 and the second region R2, (3) forming the optical element, (4) forming the first interlayer insulating layer II L1, (5) forming the electric element, (6) forming the multilayer wiring layer MWL, and (7) forming the protective layer PL.

The method of manufacturing the semiconductor device SD2 is the same as the method of manufacturing the semiconductor device SD1 according to the first embodiment except that the first region R1 and the second region R2 are formed so that the second region R2 surrounds the first region R1 in plan view in the step of forming the first region R1 and the second region R2.

(Effect)

The semiconductor device SD2 according to the second embodiment also exhibits similar effect as the semiconductor device SD1 according to first embodiment.

Modification of Second Embodiment

Figure 16:
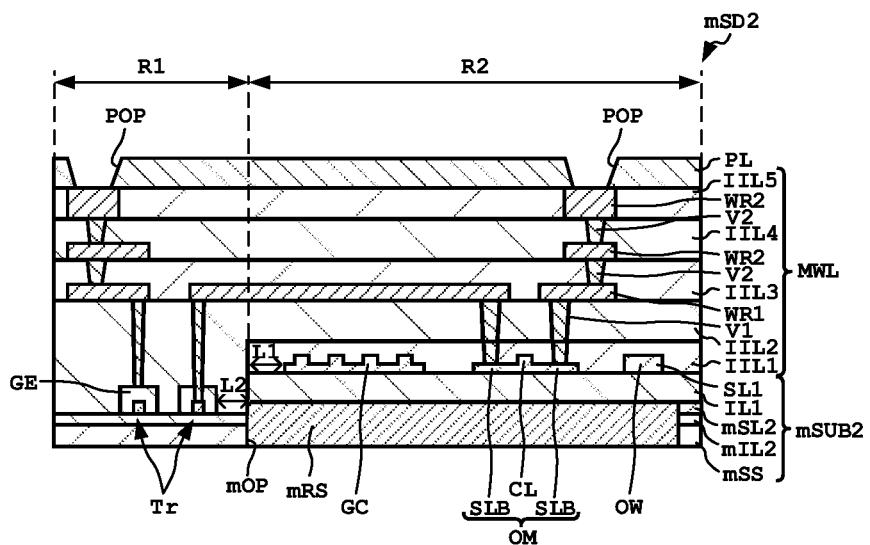
FIG. 16 is a cross-sectional view showing an exemplary configuration of a main portion of a semiconductor device according to a modification of the second embodiment.

FIG. 16 is a cross-sectional view showing an exemplary configuration of a main portion of the semiconductor device mSD2 according to the modification of the second embodiment.

As shown in FIG. 16, in the semiconductor device mSD2 according to the modification, an opening mOP is formed on the back surface of the substrate mSUB2. In the present modification, the opening mOP penetrates the semiconductor substrate mSS, the second insulating layer IL2, and the second semiconductor layer SL2. The first insulating layer IL1 is exposed at the bottom of the opening mOP. The resin layer may or may not be formed in the opening mOP. From the viewpoint of increasing the strength of the semiconductor device mSD2, it is preferable that the resin layer is formed in the opening mOP. In the present modification, the resin layer mRS is formed in the opening mOP.

The material and method of forming the resin layer mRS are similar to those of the semiconductor device mSD11 according to the modification of the first embodiment.

It should be noted that the present invention is not limited to the above-mentioned embodiments, and various modifications can be made without departing from the gist thereof. For example, when the wiring is a copper wiring, a known damascene structure may be employed as the wiring structure. The wiring can then be produced by known damascene processes.

In addition, even when a specific numerical value example is described, it may be a numerical value exceeding the specific numerical value, or may be a numerical value less than the specific numerical value, except when it is theoretically obviously limited to the numerical value. In addition, the component means "B containing A as a main component" or the like, and other components may be contained.

What is claimed is:

1. A semiconductor device comprising:
   a substrate having a first region and a second region, the first region and the second region differing from each other;

a first optical element formed in one of the first region and the second region; and an electric element formed in another of the first region and the second region, wherein the first region comprises:
 a first insulating layer; and
 a first semiconductor layer formed on the first insulating layer, wherein the second region comprises:
 the first insulating layer;
 the first semiconductor layer;
 a second insulating layer formed on the first semiconductor layer; and
 a second semiconductor layer formed on the second insulating layer, wherein the first optical element is an optical waveguide formed in the first region and formed of the first semiconductor layer, and wherein the electric element is a transistor formed in the second region and formed of the second semiconductor layer.

2. The semiconductor device according to claim 1, wherein the first region surrounds the second region in plan view.

3. The semiconductor device according to claim 1, wherein the first optical element is an optical waveguide formed of monocrystalline silicon.

4. The semiconductor device according to claim 1,
wherein a first opening is formed on a back surface of the first semiconductor layer, and
wherein the first opening overlaps with the first optical element in plan view.

5. The semiconductor device according to claim 4, wherein a resin layer is formed in the first opening.

6. The semiconductor device according to claim 4, comprising a second optical element formed in one of the first region and the second region,
wherein a second opening is formed on a back surface of the first semiconductor layer at a position differing from the first opening, and
wherein the second opening overlaps with the second optical element in plan view.

7. A semiconductor device comprising:
 a substrate having a first region and a second region, the first region and the second region differing from each other;
 a first optical element formed in one of the first region and the second region; and
 an electric element formed in another of the first region and the second region, wherein the first region comprises:
 a first insulating layer; and
 a first semiconductor layer formed on the first insulating layer, wherein the second region comprises:
 the first insulating layer;
 the first semiconductor layer;
 a second insulating layer formed on the first semiconductor layer; and
 a second semiconductor layer formed on the second insulating layer, and wherein the first optical element is an optical modulator and is electrically coupled with the electric element.

8. The semiconductor device according to claim 7, wherein a widthwise direction of an optical waveguide in the optical modulator is along a crystallographic direction of the first semiconductor layer.

9. The semiconductor device according to claim 7, wherein the first optical element is an optical waveguide formed of monocrystalline silicon.

10. The semiconductor device according to claim 7,
wherein a first opening is formed on a back surface of the first semiconductor layer, and
wherein the first opening overlaps with the first optical element in plan view.

11. The semiconductor device according to claim 10, wherein a resin layer is formed in the first opening.

12. The semiconductor device according to claim 10, comprising a second optical element formed in one of the first region and the second region,
wherein a second opening is formed on a back surface of the first semiconductor layer at a position differing from the first opening, and
wherein the second opening overlaps with the second optical element in plan view.

* * * * *